United States Patent [19]

Wolstenholme et al.

[11] Patent Number: 5,512,504
[45] Date of Patent: Apr. 30, 1996

[54] METHOD OF MAKING A MEMORY ARRAY WITH FIELD OXIDE ISLANDS ELIMINATED

[75] Inventors: Graham Wolstenholme, Boise, Id.; Albert Bergemont, San Jose; Etan Shacham, Cupertino, both of Calif.

[73] Assignee: National Semiconductor Corporation, Santa Clara, Calif.

[21] Appl. No.: 370,487

[22] Filed: Jan. 9, 1995

Related U.S. Application Data

[60] Division of Ser. No. 126,506, Sep. 24, 1993, Pat. No. 5,422,824, which is a continuation-in-part of Ser. No. 994,120, Dec. 21, 1992, Pat. No. 5,319,593.

[51] Int. Cl.$^6$ .............................................. H01L 21/8747
[52] U.S. Cl. .................. 437/43; 437/45; 437/48; 437/52
[58] Field of Search ................... 437/43, 45, 46, 437/48, 52

[56] References Cited

U.S. PATENT DOCUMENTS

| | | | |
|---|---|---|---|
| 4,295,209 | 10/1981 | Donley | 365/178 |
| 4,342,100 | 7/1982 | Kuo | 365/104 |
| 4,651,302 | 3/1987 | Kimmel et al. | |
| 4,745,579 | 5/1988 | Mead et al. | |
| 4,887,238 | 12/1989 | Bergemont et al. | |
| 4,895,520 | 1/1990 | Berg | 437/45 |
| 5,065,364 | 11/1991 | Atwood et al. | |
| 5,117,389 | 5/1992 | Yiu | 365/104 |
| 5,204,835 | 4/1993 | Eitan | 365/185 |

FOREIGN PATENT DOCUMENTS

| | | |
|---|---|---|
| 0488804A1 | 6/1992 | European Pat. Off. |
| 4028575A1 | 3/1991 | Germany. |
| 54-161853 | 12/1979 | Japan .............. G11C 17/00 |
| 2215156 | 9/1989 | United Kingdom. |
| WO88/02172 | 3/1988 | WIPO. |

*Primary Examiner*—George Fourson
*Assistant Examiner*—Richard A. Booth
*Attorney, Agent, or Firm*—Limbach & Limbach

[57] ABSTRACT

A nonvolatile semiconductor memory, which includes an array of programmable transistor cells, such as EPROM or EEPROM cells, provides electrical isolation without the use of field oxide islands. The cells are arranged in X number of rows and Y number of columns with the cells in at least two of the rows being designated as select cells and the remaining cells being designated as memory cells. Control circuitry is provided for causing the select cells to supply programming voltages to selected ones of the memory cells. Alternate ones of the select cells are formed as implanted-channel select cells to provide electrical isolation for adjacent select cells which remain in the low threshold (active) state. The implanted-channel select cells are formed by implanting a material into the channel region of each of the implanted-channel select cells to increase the threshold voltage of the cells, thereby preventing the implanted channel select cells from conducting when normal operational voltages are applied.

10 Claims, 11 Drawing Sheets

METHOD OF MAKING A MEMORY ARRAY WITH FIELD OXIDE ISLANDS ELIMINATED

RELATED CASES

This is a divisional of application Ser. No. 08/126,507, filed Sep. 24, 1993, now U.S. Pat. No. 5,422,824 which is a continuation in part of Ser. No. 07/994,120 filed Dec. 21, 1992, now U.S. Pat. No. 5,319,593.

BACKGROUND OF THE INVENTION

1. Field of the Invention

The present invention relates generally to semiconductor memories and in particular to electrically-programmable read-only-memories (EPROMs) and electrically-erasable-programmable read-only-memories (EEPROMs) arrays which avoid the use of field oxide islands to provide electrical isolation.

2. Background Art

An electrically-programmable read-only-memory EPROM and an electrically-erasable-programmable read-only-memory (EEPROM) are non-volatile memories which maintain data stored in the memory when power is removed. EPROM devices are erased by exposure to ultraviolet light. EEPROM devices, also known as a flash memories, add complete electrical erasure and reprogramming functionality to the non-volatility of the EPROM.

FIG. 1 is a diagram of a conventional EPROM or EEPROM memory array 10 of 16 memory cells. FIGS. 2A and 2B are taken through section lines 2A—2A and 2B—2B of FIG. 1. Exemplary memory cell 12A includes a drain region 14 and source region 22.

Adjacent exemplary memory cell 12B includes a drain region 14 shared in common with memory cell 12A.

A word line 16 made of doped polysilicon (poly 2) functions as a control gate for the transistors. Floating gates 24 are made of doped polysilicon (poly 1) and are disposed between the transistor memory cell channels and the word lines 16 (FIG. 2B). A thin oxide 20 extends over the surface of the memory cells and between the floating gates 24 and the memory cell channel region.

Contact openings 15 are formed so that the metal bit line 18 can contact the drains of the memory cells. As can be seen in FIG. 1, buried N+ bit lines 18 function to connect the source regions together. As shown in FIG. 2B, the source regions 22 are comprised of an N+ region.

FIG. 3 illustrates the manner in which the memory cells 12 are programed. A relatively high voltage Vpp (typically 13 volts) is applied to the poly 2 word line 16 (the control gate). An intermediate voltage Vd (typically 6 volts) is applied to the drain region 14 and a low voltage Vss (typically 0 volts) is applied to the source region 22. "Hot" electrons are generated at the edge of the drain. The high voltage Vpp on the control gate electrode (poly 2 word line) 16 causes some of the free electrons to cross the gate oxide 20 and enter the floating gate (poly 1) 24 where the electrons remain trapped.

Erasure is accomplished by discharging the floating gate 24. In the case of an EPROM cell, the discharge is accomplished by exposure to U.V. light. In the case of a flash memory cell, the erasure mechanism is Fowler-Nordheim tunneling, as is well known.

A memory cell is read by applying voltage Vd (typically +3 volts) to the drain and grounding the source (Vss). A positive voltage (Vcc) is applied to the control gate (word line) 16. If the cell had been previously programmed, the electrons will have increased the threshold voltage of the cell and the gate/source voltage will not be sufficient to render the cell conductive. Thus, no current will flow. Conversely, if the cell has not been programmed, the gate/source voltage will be sufficient to render the cell conductive and current will flow. Current flow or lack thereof is detected by a sense amplifier (not depicted).

FIG. 4 is a schematic diagram of a segment of an exemplary conventional memory array which includes a total of twelve memory cells Q1–Q12, with cells Q1–Q4, Q5–Q8 and Q9–Q12 being in separate rows and having common word lines WL-1, WL-2 and WL-3, respectively. The three depicted bit lines are BL-1, BL-2 and BL-3. The appropriate bit lines are connected to four exemplary select transistors 28A–28D, there being at least one select transistor associated with each column of memory cells. Bit lines BL-1 and BL-3 comprise N+ lines which are strapped with metal bit lines (not depicted) which can be accessed by way of contacts 30A and 30B. Bit line BL-2 is a buried line which can be accessed indirectly through select transistors 28B and 28C.

Select transistors 28A and 28B are in a common row and have their control gates connected to select line Select 1. Similarly, select transistors 28C and 28D are in a common row and have their control gates connected to select line Select 2. Preferably, a second set of select transistors 28A', 28B', 28C' and 28D' are provided which are connected to the opposite end of the memory cell segment in the same manner as select transistors 28A, 28B, 28C, and 28D. A second pair of select lines Select 1' and Select 2', driven in parallel with lines Select 1 and Select 2, respectively, are provided for controlling the second set of select transistors. The second set of select transistors are connected to contacts 30A' and 30B' which are driven in parallel with contacts 30A and 30B, respectively.

Referring to FIG. 5, a plan view of a layout of an integrated circuit implementing the memory array segment of FIG. 4 may be seen. The second set of select transistors 28A', 28B', 28C' and 28D' are not depicted. Each cell of the array is located in the region near the intersection of a bit line BL and a word line WL. Select transistor 28A is disposed in the region near the intersection of bit line BL-1 and select line Select 1. Similarly, select transistors 28B, 28C and 28D are located near the regions of the intersection of line Select 1/bit line B1-3, line Select 2/bit line Bl-1, and line Select 2/bit line BL-4, respectively.

Electrical isolation is provided by the use of field oxide (FOX) regions. When the FOX regions are disposed in the array of select transistors or memory cells, they are commonly referred to as FOX islands. By way of example, FOX island 32A extends down into the regions between transistors 28A and 28B. There is also a FOX island 32C between transistor 28C and an select transistor not depicted. As a further example, a FOX island 32D is disposed between transistors 28C and 28D.

The select transistors 28A–28D are typically conventional MOS transistors rather than the floating gate transistor such as devices Q1–Q12 used as memory cells. However, it has become conventional to simplify circuit layout by using the same floating gate transistor devices used as memory cells as the select transistors. The floating gate select transistors are all unprogrammed so that no charge exists on the floating gate. Accordingly, the threshold voltage of the floating gate transistor is sufficiently low to permit the cell to perform the select function accomplished by conventional select transistors.

The use of the same type of floating gate transistor in both the memory cell array and the cell select section has provided an improved memory layout scheme. However, shortcomings remain in such conventional approaches.

The FOX islands 32 located in the FIG. 5 memory are disadvantageous for several reasons. First, the intersection of the FOX islands 32 and bit/select lines represents the largest step in the array. FIG. 6 shows a cross-section taken through section line 6—6 of FIG. 5 along the select line Select 2. The maximum height of the structure is the combination of select line Select 2 and the poly 1 line 24 above the FOX islands 32.

Referring to FIG. 7, which is a cross-section taken from FIG. 5 and which is at right angle to the FIG. 6 cross-section, the distance from the center of the FOX island 32D to the top surface of the island is typically about 2000 Å. The thickness of the poly 1 floating gate 24 is typically 2000 Å and the thickness of the dielectric ONO (oxide-nitride-oxide) sandwich layer 40 is 300 Å. Added to this is the poly 2 layer and the tungsten silicide layer which total 4500 Å and which form the Select 2 line. This gives a grand total of approximately 8800 Å. It is difficult to reliably planarize a deposited oxide layer, such as BPSG (borophosphosilicated glass) over a step of this magnitude.

In addition, the presence of a FOX island 32 disposed in the memory array results in a tendency to produce Poly 1 stringers at Poly 1 and SAE etch (self aligned etch). Further, the FOX islands increase the size of the array and also increase the resistance of the bit lines.

The present invention eliminates the necessity of providing electrical isolation between select transistors using FOX islands. Accordingly, the disadvantages arising from the use of FOX islands noted above are eliminated. These and other advantages of the present invention will become apparent to those skilled in the art upon a reading of the following Detailed Description of the Invention together with the drawings.

SUMMARY OF THE INVENTION

The present invention is directed to an electrically programmable semiconductor memory which includes an array of programmable transistor cells. One example, is a floating gate transistor which includes a floating gate electrode and a control electrode such as used in EPROM and EEPROM memories. Such cells can be either programmed to a high threshold state (with a charge being placed on the floating gate) or a low threshold voltage state (with no charge on the floating gate). In the low threshold state the cell can be rendered conductive with a relatively low applied control gate voltage whereas such low control gate voltage would be insufficient to render the cell conductive when the cell has been programmed to the high threshold state.

The cells are arranged in Y number of columns and X number of rows with at least one of the rows of cells being designated as memory cells and at least two of the rows being designated as select cells. The select cells within the at least two rows of select cells includes a plurality of implanted-channel select cells. The implanted-channel select cells can be formed, for example, so that, in going across each row and down each column of the at least two rows of select cells, every other select cell is formed as an implanted-channel select cell. Typically, the memory would include considerably more rows of memory cells than rows of select cells.

The memory further includes control means for causing the select cells to supply operational voltages, such as reading or programming voltages, to selected ones of the memory cells. Such programming voltages may include, for example, a positive voltage to be applied to the drain electrode of the memory cell and a ground connection to be applied to the source electrode of the cell.

The plurality of implanted-channel select cells eliminates the requirement that field oxide (FOX) islands be used for the purpose of providing electrical isolation between the select cells. The plurality of implanted-channel select cells can be formed by implanting the channel region of each implanted-channel cell with a material, such as boron, that increases the threshold voltage of the cell. Alternately, only a portion of the channel region, such as the region adjacent to the source region, can be implanted. By increasing the threshold voltage of the cell, the implanted-channel select cells will not conduct when normal operational voltages, e.g. reading and programming, are applied. The remaining select cells can be set to a low threshold state and can then be used to apply the programming voltages to the memory cells. By not conducting, the plurality of implanted-channel select cells disposed intermediate the cells set to the low voltage state, function to provide electrical isolation which has been typically provided by FOX islands. The avoidance of such FOX islands eliminates various problems associated with their use.

The subject invention is also directed to a method of fabricating a plurality of implanted-channel cells which are located within a nonvolatile semiconductor memory which includes an array of programmable transistor cells arranged in Y number of columns and X number of rows. Such cells may include, for example, EPROM or EEPROM memory cells having floating and control gate electrodes.

The method includes the step of providing a substrate and forming a layer of sacrificial oxide on the substrate. Once the sacrificial oxide is formed, an implant mask is formed on the layer of sacrificial oxide. The implant mask defines the channel region of each of the implanted-channel select cells. Next, the channel regions are implanted with a material, such as boron, that increases the threshold voltage of the cells. Following this, the implant mask and the layer of sacrificial oxide are removed. A layer of gate oxide is then formed on the substrate and the process continues with conventional steps. Alternatively, the implant mask can be formed to define only a portion of the channel region.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
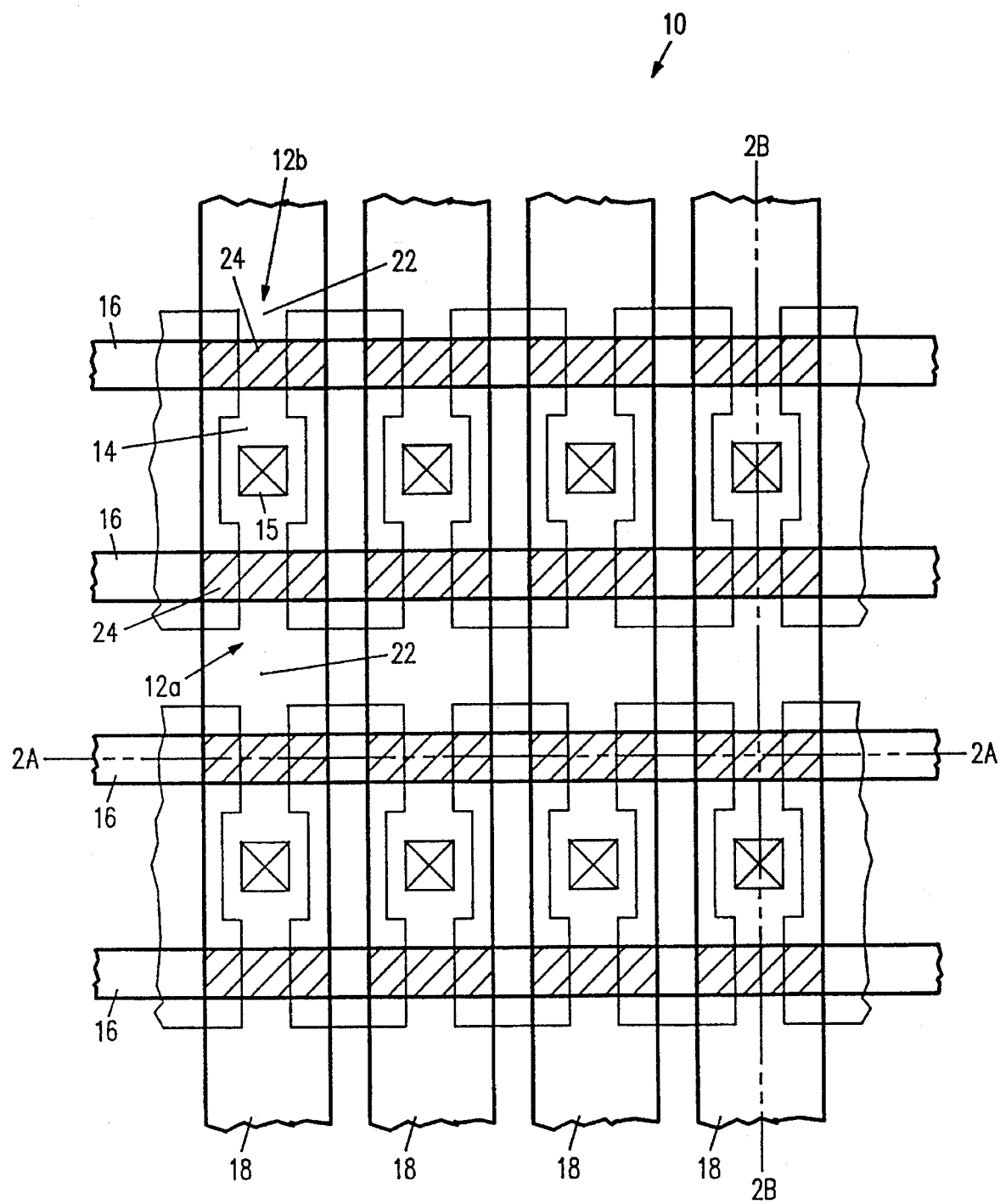
FIG. 1 is a plan view of a segment of the memory cell array of a conventional EPROM or EEPROM array showing, among other things, the orthogonal bit lines and word lines.
Figure 2A:
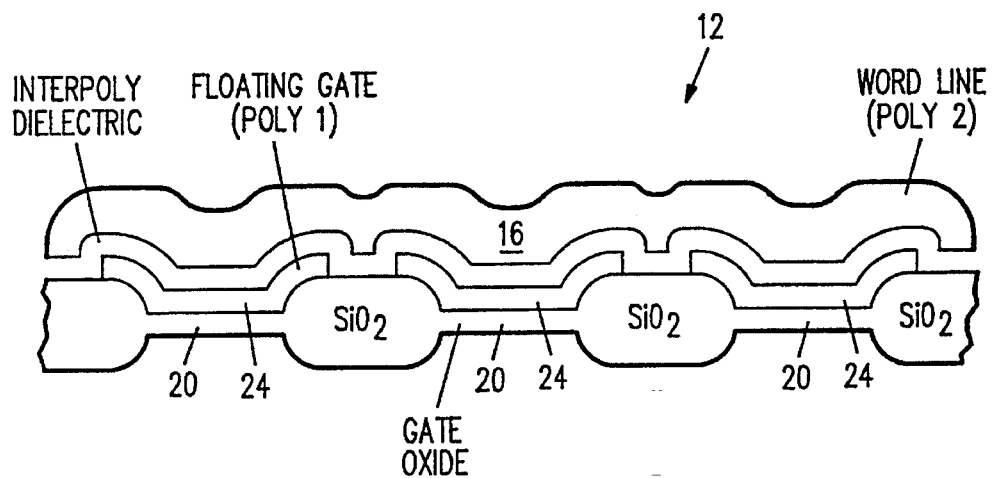
FIG. 2A is a sectional view of the memory cell array of FIG. 1 taken through section lines 2A—2A.
Figure 2B:
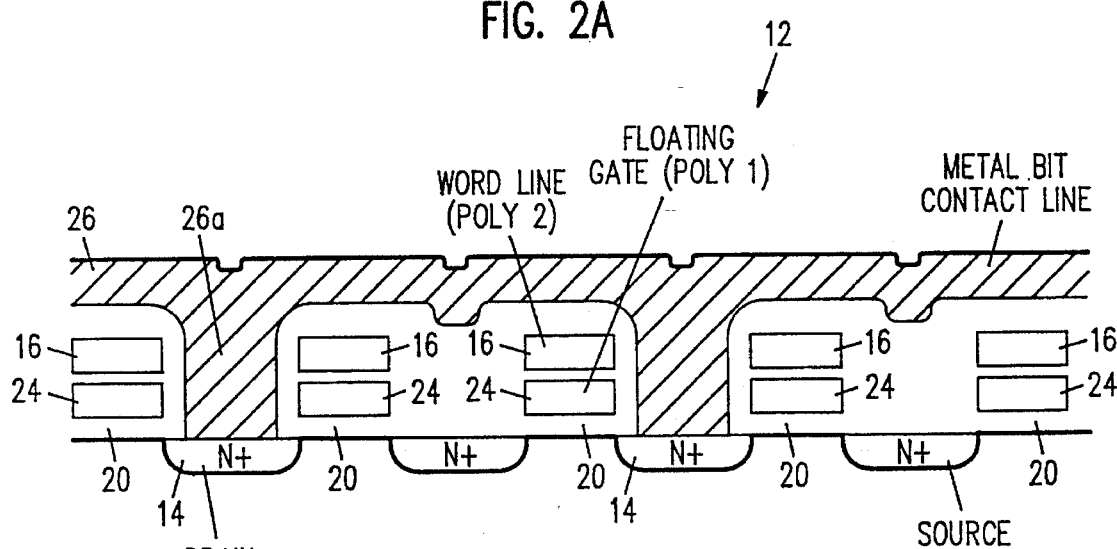
FIG. 2B is a sectional view of the memory cell array of FIG. 1 taken through section lines 2B—2B thereof.
Figure 3:
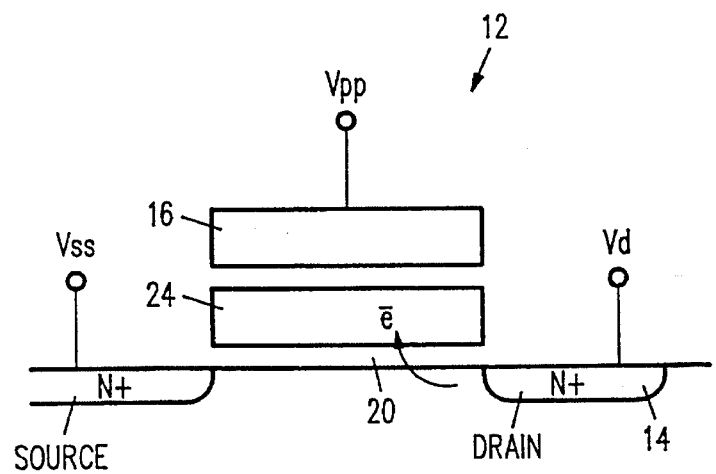
FIG. 3 is a diagram of an conventional EPROM cell depicting the manner in which the cell is programmed.
Figure 4:
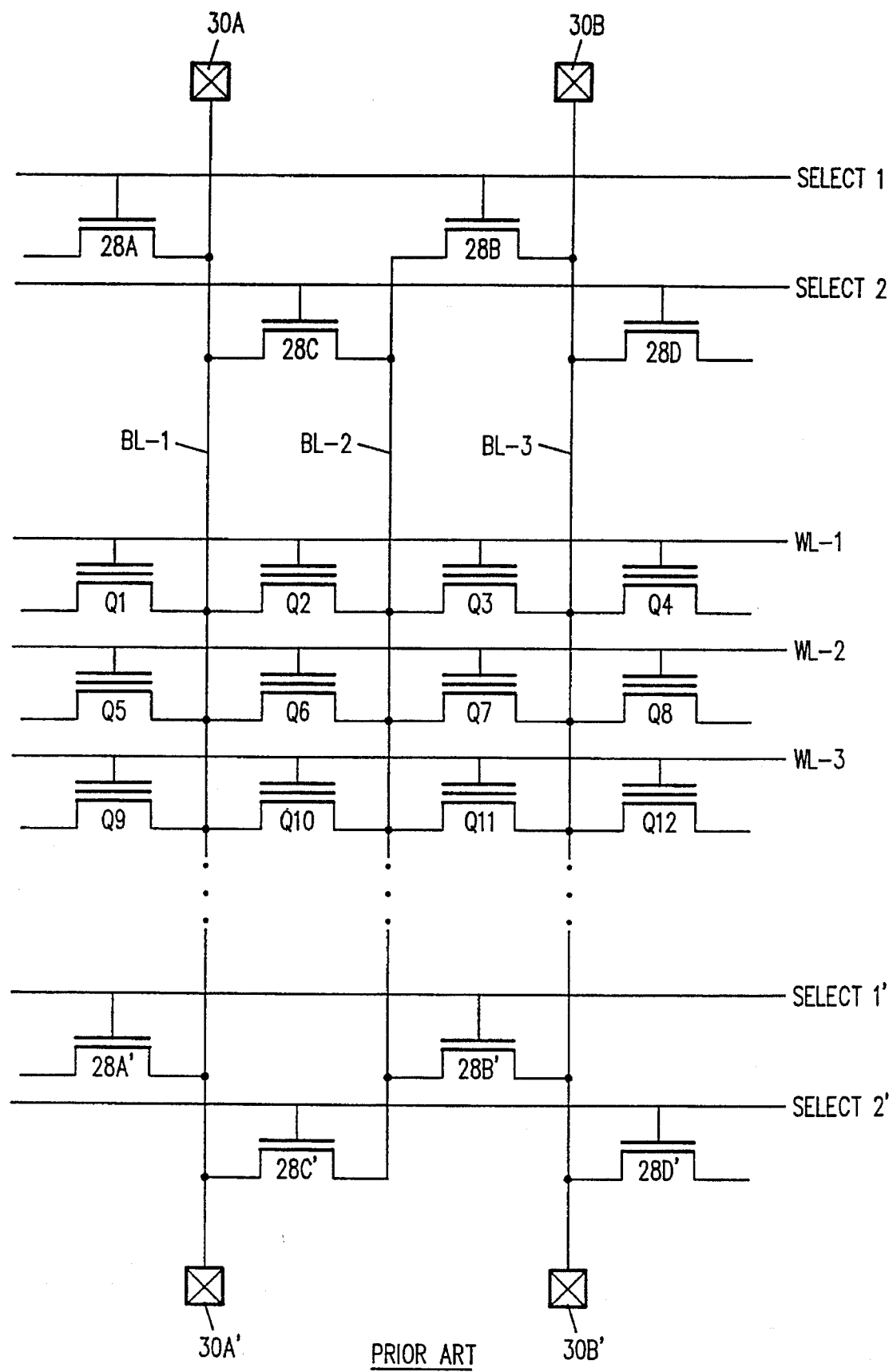
FIG. 4 is a schematic diagram of a segment of a conventional memory, including twelve memory cells and eight memory cell select transistors.
Figure 5:
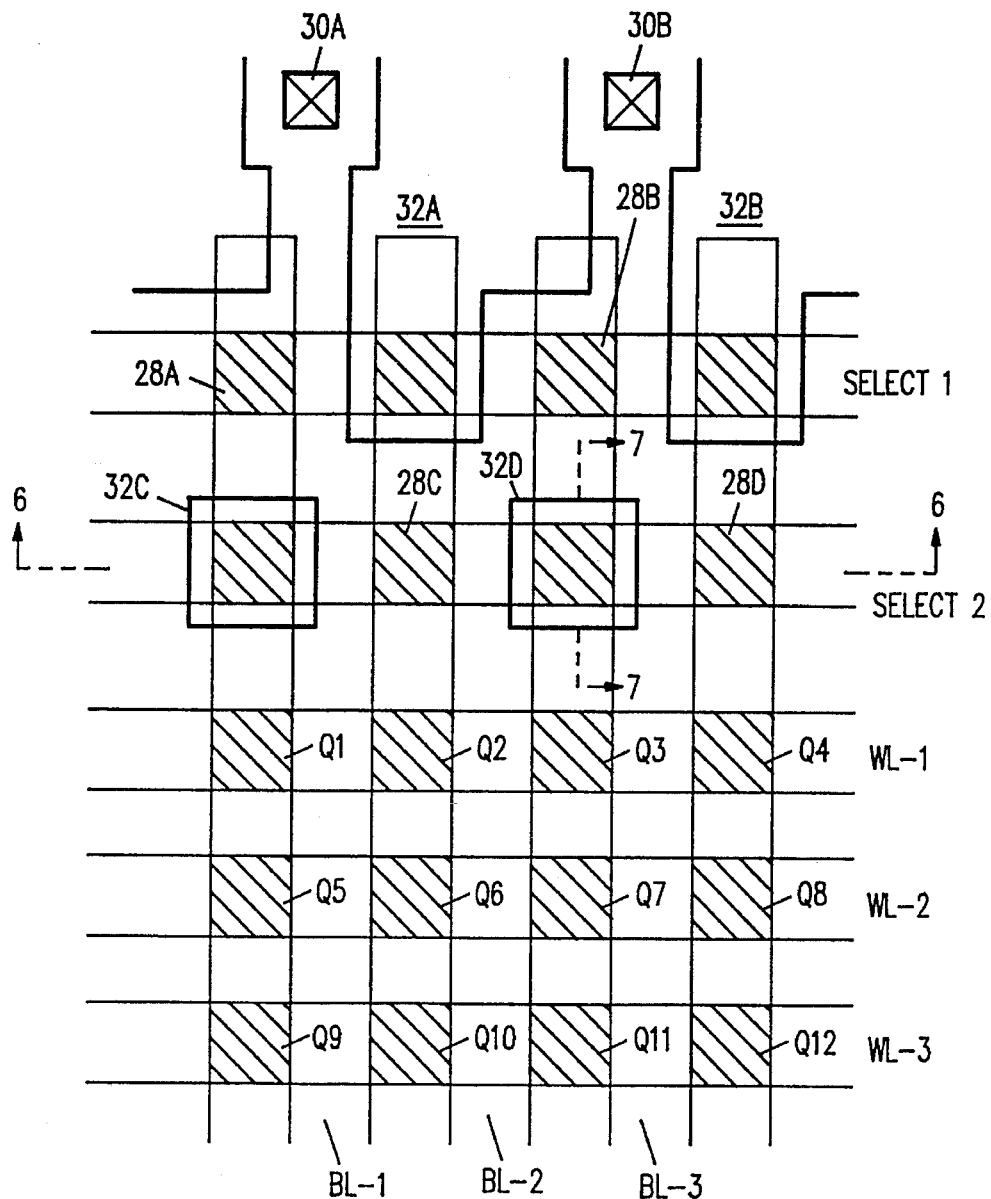
FIG. 5 is a plan view of the segment of a conventional memory in accordance with the schematic diagram of FIG. 4.
Figure 8:
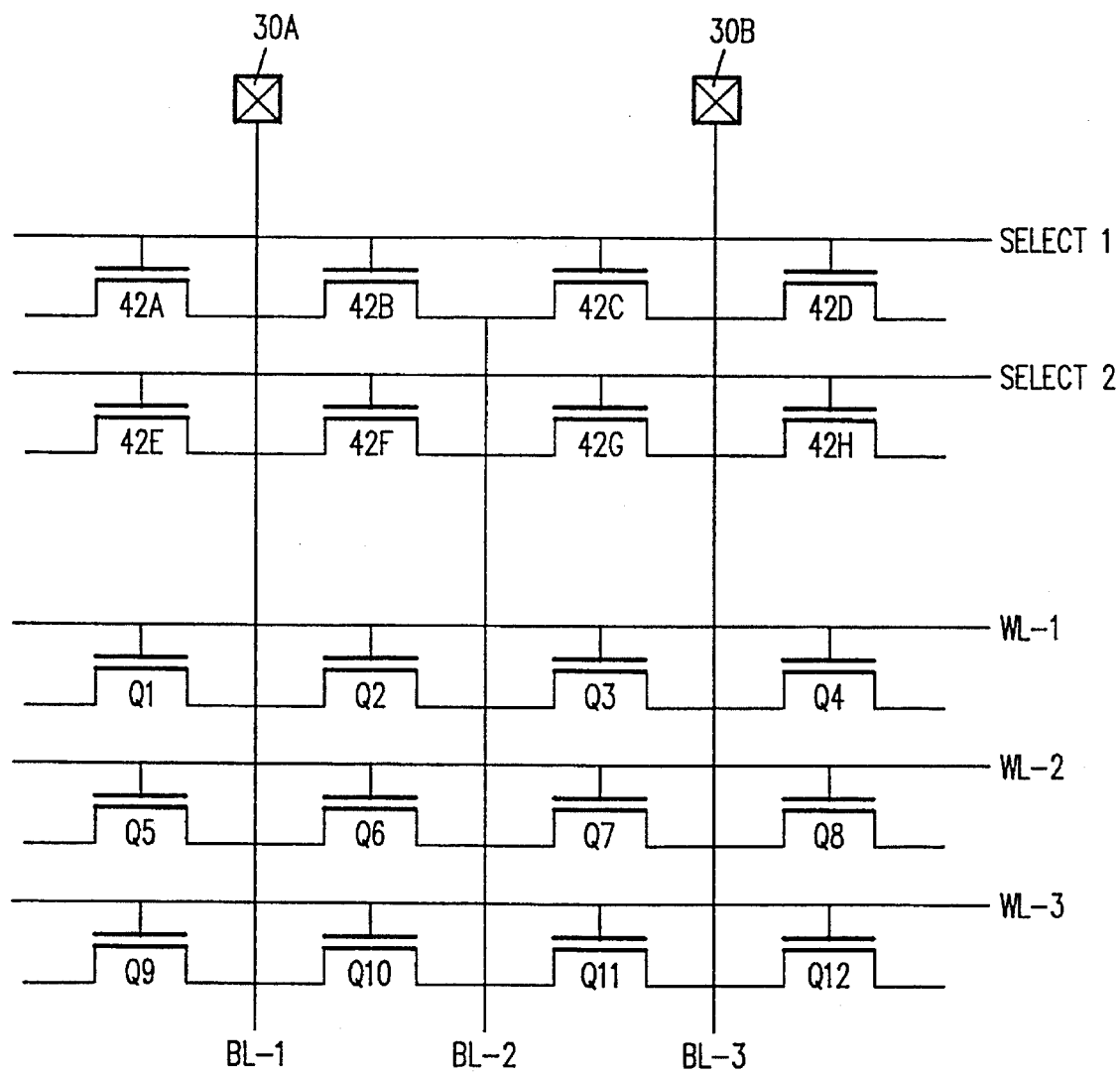
FIG. 8 is a schematic diagram of a memory segment in accordance with the present invention.

Referring again to the drawings, FIG. 8 is a schematic diagram of a segment of a memory which incorporates the subject invention. The memory cells, sometimes referred to herein as programmable transistor cells, Q1–Q12 are similar to the floating gate transistor devices that are used in the prior art memory of FIG. 4 and as shown in FIG. 3. The select transistors 42A–42H are also preferably floating gate transistor devices such as shown in FIG. 3. Note that, although not depicted, there is preferably another set of select transistors disposed at the opposite end of the memory cells which are driven in parallel with the depicted select transistors.

As previously described, the use of floating gate transistor devices in the memory cell select portion of a memory was known. However, the previous designs still require the use of FOX islands to provide isolation. The present invention provides isolation between adjacent select transistors by using a floating gate cell or similar programmable cell which has been programmed to a high threshold state. Thus, unlike the unprogrammed select transistors, the isolation transistors will not be rendered conductive when programming voltages are applied for the purpose of programming the cell of the memory array.

The cell select circuitry of FIG. 8 thus includes a transistor select device in each column of the memory cells. Every other cell select transistor device is programmed to a high threshold (inactive) state so the low threshold (active) state cell select devices can perform the function of accessing the appropriate memory cells. The inactive select devices further function to provide the necessary electrical isolation between adjacent active devices.

Figure 6:
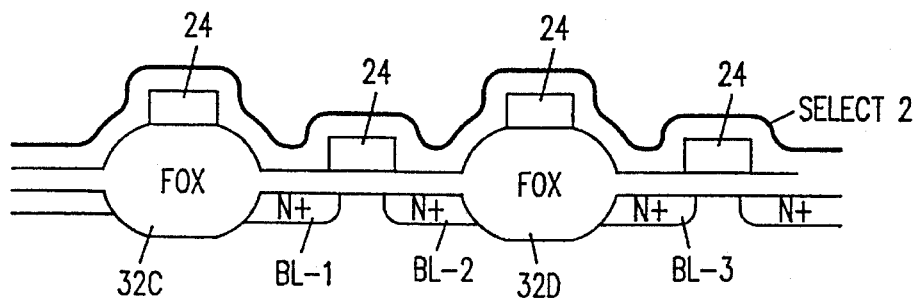
FIG. 6 is a sectional view of the conventional memory of FIG. 5 taken through section line 6—6 thereof.
Figure 7:
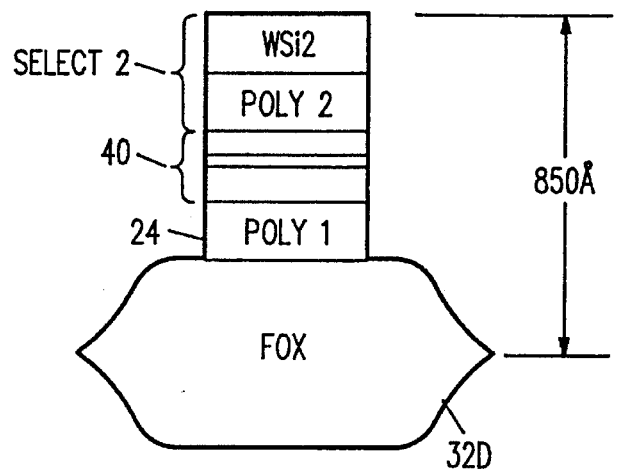
FIG. 7 is an enlarged sectional view of the conventional memory of FIG. 5 taken through section line 7—7 thereof.
Figure 9:
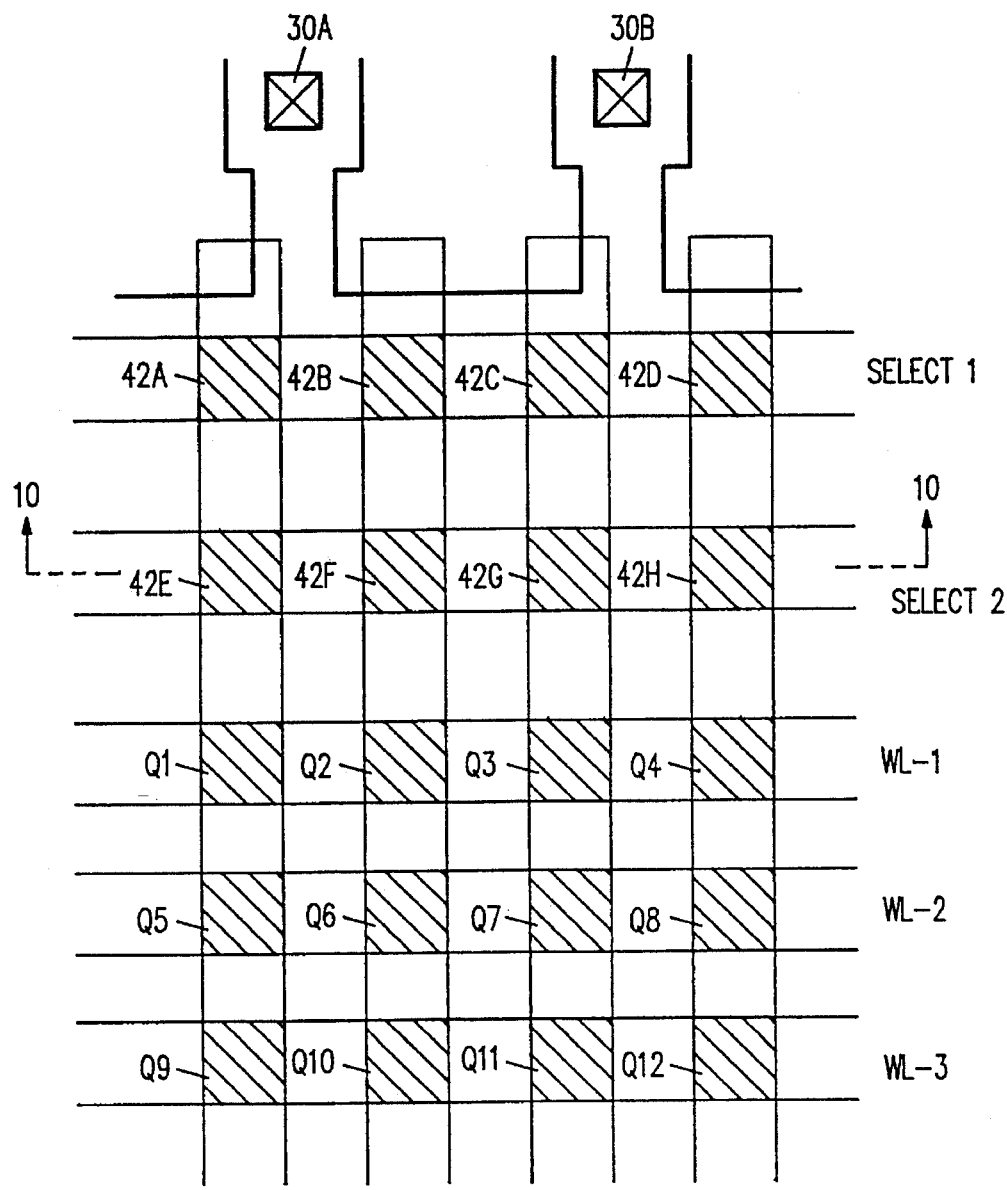
FIG. 9 is a plan view of the segment of the memory of FIG. 8 and in accordance with the present invention.
Figure 10:
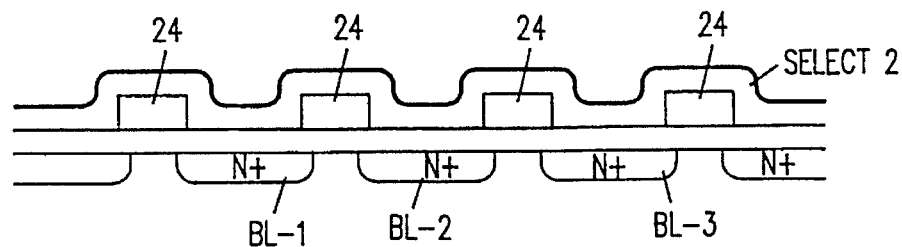
FIG. 10 is a sectional view of the memory segment of FIG. 9 taken through section lines 10—10 thereof.

FIG. 9 shows the symmetry of the layout of a memory constructed in accordance with the present invention. FOX islands are not used for isolation, therefore the attendant problems previously noted do not occur. As can be seen in the cross-section of FIG. 10, taken through section line 10—10 of FIG. 9, the maximum step height is dramatically reduced in comparison to the prior art structure shown in FIGS. 6 and 7.

The select transistors 42 must initially be programmed to the proper state. Alternate ones of the select transistors, along both the rows and columns, are programmed to a high threshold state (inactive). The select transistors disposed intermediate the high threshold transistors remain in the low threshold state (active) and are used to access the memory cell transistors.

Figure 11A:
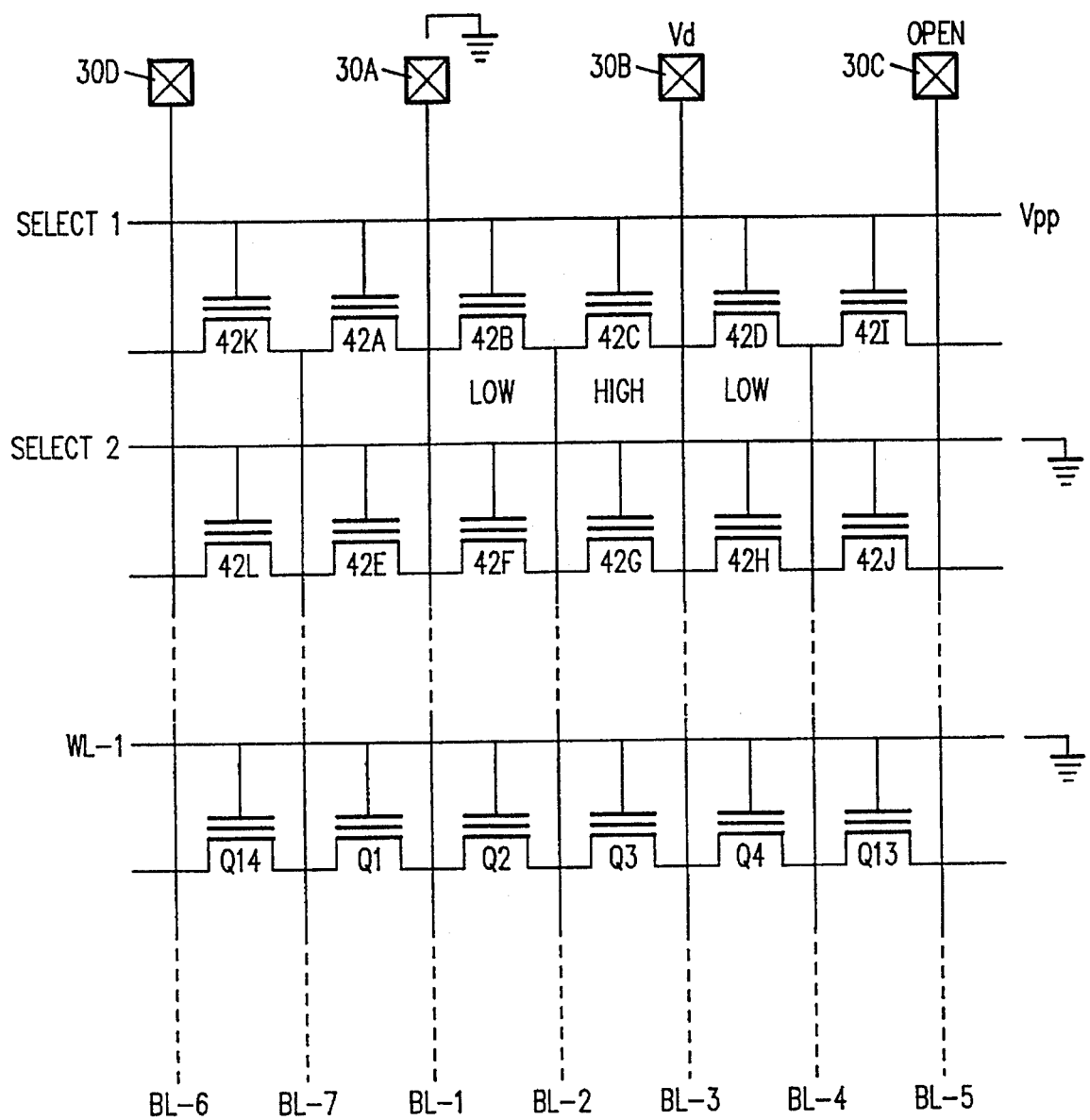
FIG. 11A shows the manner in which the select transistors of the FIG. 8 array of the present invention may be programmed.

FIG. 11A depicts the manner in which the appropriate select transistors are programmed to a high threshold state. The FIG. 11A structure is similar to that of FIG. 8 except additional structure is shown. In the programming example of FIG. 11A, select transistor 42C is being programmed to a high threshold state.

First, the word lines WL associated with the memory cells are all forced to ground potential. In addition, the Select 2 line associated with the row of select transistors not being programmed is forced to ground potential. Line Select 1, associated with select transistor 42C is raised to the high potential Vpp. Contact 30C associated with bit line BL-5 is left open (floating) and contact 30A associated with bit line BL-1 is forced to ground potential.

Transistor 42B is already in a low threshold state and will be rendered conductive by the potential Vpp applied to the gate electrode. Conductive transistor 42B will function to bring the source electrode (connected to bit line BL-2) of transistor 42C close to ground, with voltage Vd (typically +6 volts) being applied directly to the drain electrode (connected to bit line BL-3). Thus, as can be seen in FIG. 3A, the appropriate voltages are applied to transistor 42C to program the transistor to a high threshold state.

Figure 11B:
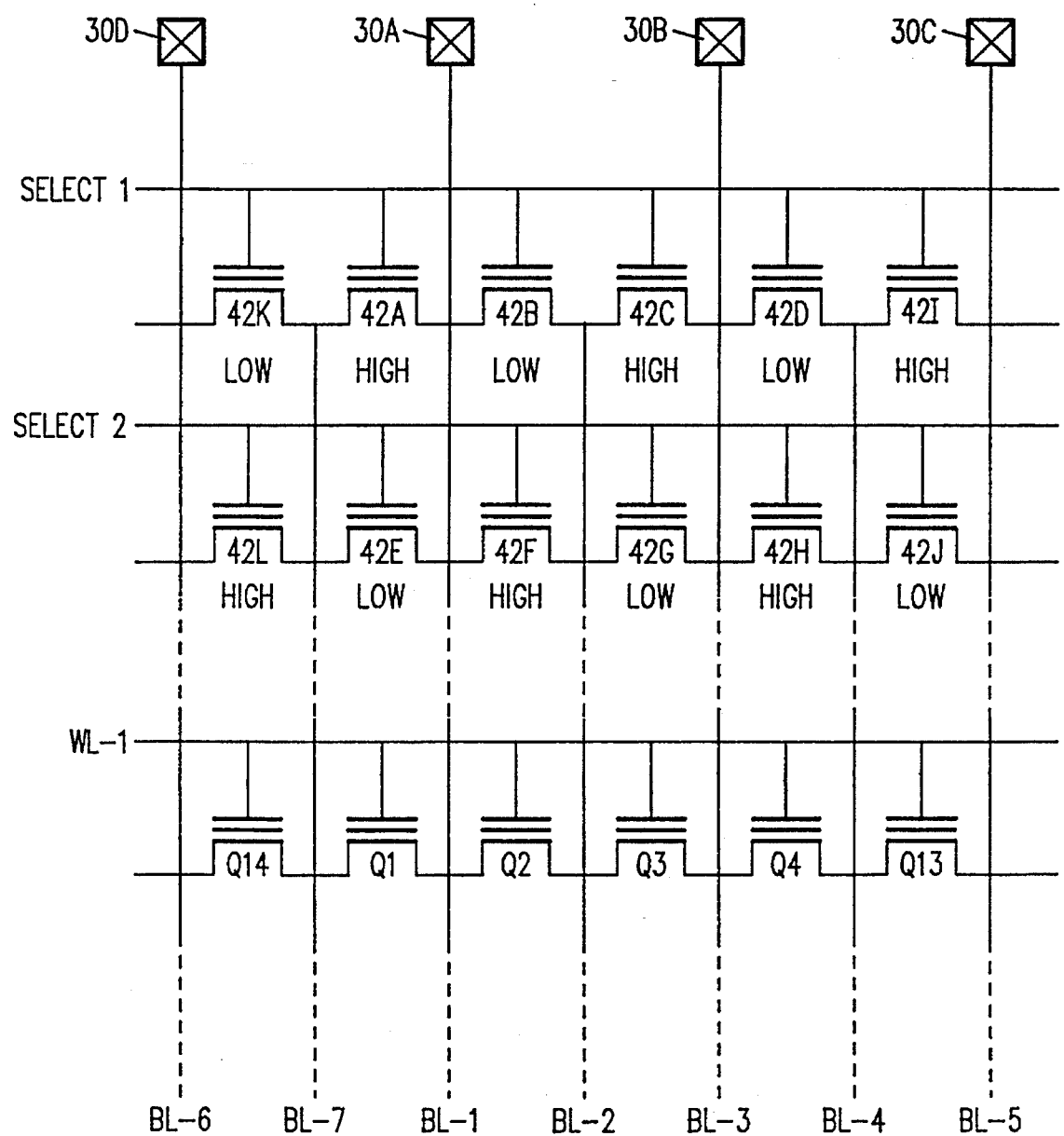
FIG. 11B shows the select transistor section of the FIG. 8 array after the select transistors were programed.

The remaining alternating select transistors are also programmed to a high threshold state as shown in FIG. 11B. As can be seen in the figure, the threshold levels of the select transistors 42 alternate between along the rows (X axis) and along the columns (Y axis).

Figure 11C:
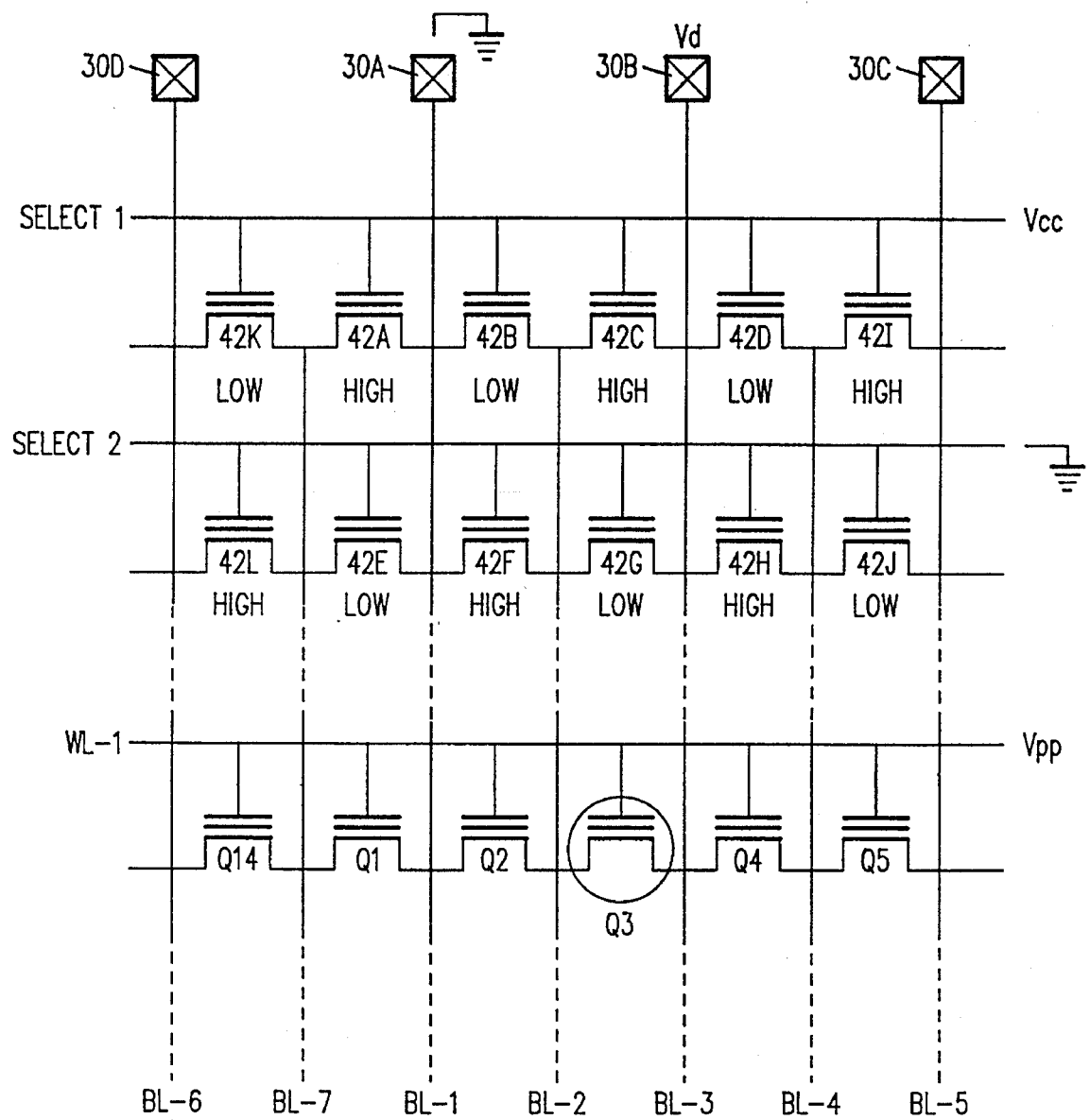
FIG. 11C shows the manner in which a cell of the FIG. 8 array is programmed.

Once the select transistors have been programmed, the memory cells may be programmed. FIG. 11C shows the manner in which an exemplary memory cell Q3 is programmed in the memory array. Ground potential is applied to contact 30A and voltage Vcc is applied to the Select 1 line. Voltage Vcc is applied to contact 30B. This combination of voltages causes low threshold select transistor 42B to become conductive. The voltage is not sufficient, however, to render high threshold transistor 42C conductive.

High voltage Vpp is applied to word line WL-1 for the row in which the cell Q3 is located. Voltage Vd is connected to the drain electrode of cell Q3 and the source electrode of Q3 is coupled to ground potential by way of select transistor 42B. Thus, the voltages applied to cell Q3 are appropriate for programming the cell. Meanwhile, the high threshold select transistors function to provide electrical isolation for adjacent low threshold devices.

Figure 12:
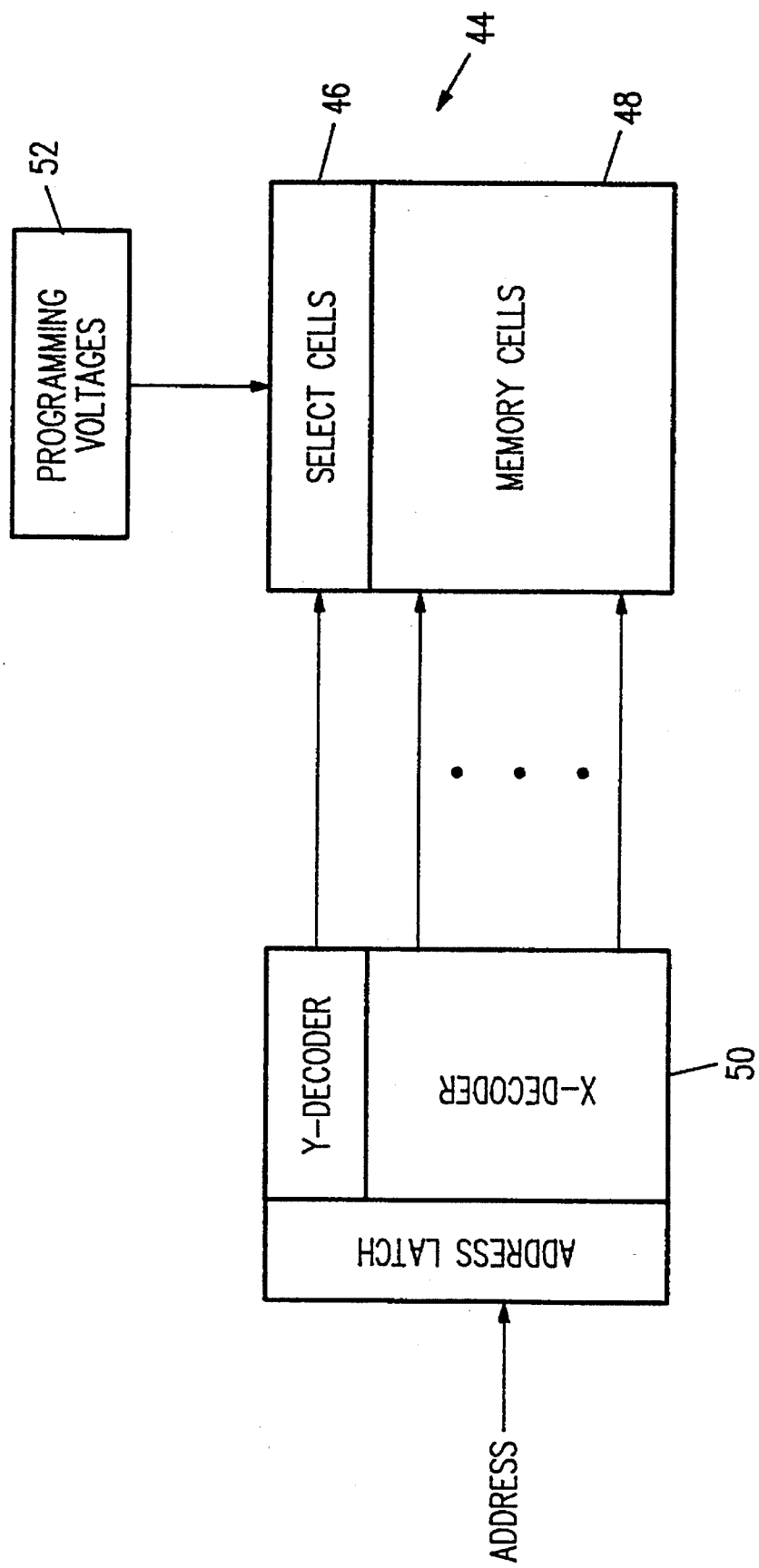
FIG. 12 is a simplified block diagram of the subject invention.

FIG. 12 is a simplified overall block diagram of the subject invention. The array, generally designated by the numeral 44, includes Y number of rows and X number of columns of transistor cells. At least two of the rows are designated as select cell to form a select cell array 46 and the remaining cells are designated as memory cells to form a memory cell array 48.

Element 50 represents a conventional address decoder and element 52 represents the conventional control circuitry for causing the select cells to supply the various voltages used for programming the memory cell array 48.

Referring again to FIG. 11B, in a first alternative embodiment of the present invention, instead of programming each of the alternating select transistors 42A, 42C, 42I, 42L, 42F, and 42H to a high threshold (inactive) state to isolate the remaining select transistors 42K, 42B, 42D, 42E, 42G, and 42J, the select transistors 42A, 42C, 42I, 42L, 42F, and 42H can alternately be formed as implanted-channel transistors. The main advantage to using implanted channel select transistors over simply electrically programming the select transistors, as described above, is that the implanted channel select transistors no longer have to be reprogrammed each time the EPROM or EEPROM device is erased.

As described in greater detail below, an implanted-channel transistor is formed by implanting boron or a similar material, such as boron difluoride ($BF_2$), into the channel region between the N+ buried bit lines. The implanted boron increases the threshold voltage of the transistor which, in turn, increases the voltage that is required to make the transistor conductive.

Thus, by controlling the concentration of boron that is implanted into the channel regions, the turn-on voltage of the alternating select transistors 42A, 42C, 42I, 42L, 42F, and 42H can be controlled. Therefore, by setting the turn-on voltage to a level which prevents transistors 42A, 42C, 42I, 42L, 42F, and 42H from conducting when normal operational voltages, e.g. programming or select voltages, are applied, the alternating select transistors 42A, 42C, 42I, 42L, 42F, and 42H will also isolate the remaining select transistors 42K, 42B, 42D, 42E, 42G, and 42J without the use of FOX islands.

Figure 13:
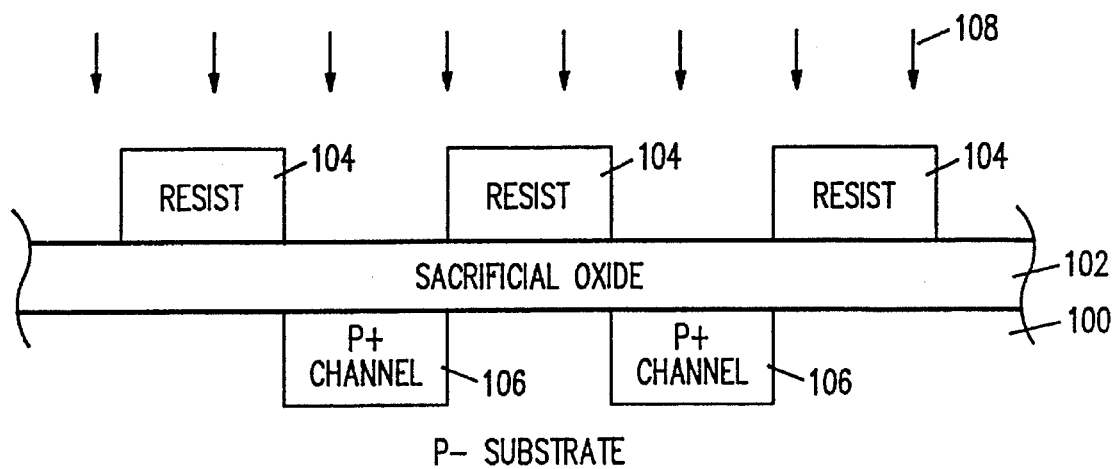
FIG. 13 is a cross-sectional diagram illustrating the initial steps of fabricating an array which includes implanted-channel select transistor devices in accordance with the concepts of the first alternative embodiment.

FIG. 13 shows a cross-sectional diagram that illustrates the initial steps of fabricating an array that includes implanted-channel select transistors in accordance with the concepts of the first alternative embodiment. As shown in FIG. 13, a layer of sacrificial oxide 102 approximately 400 Å thick is first grown on an underlying P⁻-type substrate 100.

An implant mask 104 is then formed on the layer of sacrificial oxide 102 to define the channel regions 106 of each implanted-channel select transistor device. The implant mask is formed by utilizing conventional photoresist formation, photolithographic exposure, development and removal techniques.

Once the mask has been formed, the channel regions 106 are implanted with boron 108 or a similar material, such as boron difluoride ($BF_2$), to increase the doping level in the channel regions 106. In the preferred embodiment of the first alternative embodiment, the boron 108 is implanted to a concentration of approximately $1\times10^{14}$ cm$^{-3}$. As stated above by increasing the doping level in the channel regions 106, the threshold voltages of the implanted-channel select transistors are correspondingly increased.

Once the channel regions 106 have been implanted, the implant mask is stripped and the layer of sacrificial oxide 102 is removed by etching the layer of sacrificial oxide 102 until the substrate 100 is exposed. Following this, a layer of gate oxide approximately 100–200 Å thick is grown on the substrate 100, and the process then continues in accordance with the processing steps described in U.S. Pat. No. 5,120,670, which is hereby incorporated by reference. Alternately, the processing steps can continue with conventional EPROM or EEPROM fabrication steps.

Figure 14:
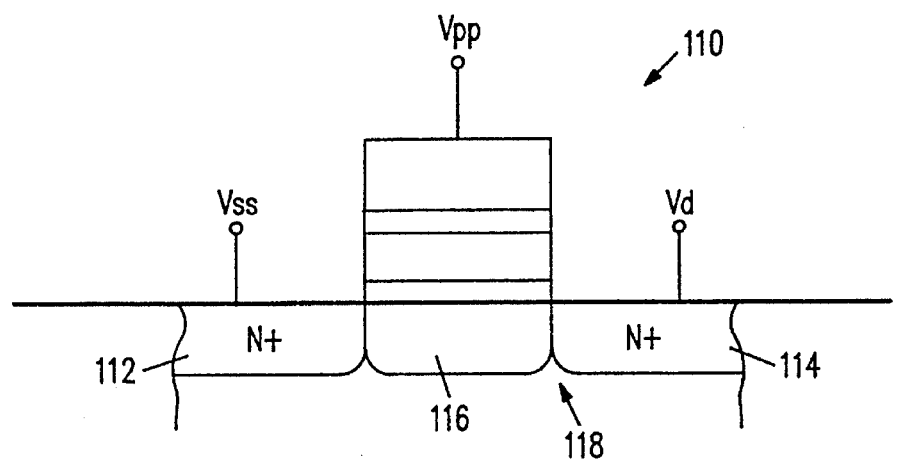
FIG. 14 is a cross-sectional diagram illustrating an implanted-channel transistor 110 which represents one of the alternating implanted-channel select transistors 42A, 42C, 42I, 42L, 42F, and 42H in the array of FIG. 11B.

FIG. 14 shows a cross-sectional diagram that illustrates an implanted-channel transistor 110 which represents one of the alternating implanted-channel select transistors 42A, 42C, 42I, 42L, 42F, and 42H in the array of FIG. 11B. As shown in FIG. 14, the implanted-channel transistor 110 includes two N+ bit line regions which form a source region 112 and a drain region 114, and an implanted-channel region 116 formed between the source region 112 and the drain region 114.

One problem with implanting the entire channel region 116 is that the breakdown voltage of the P-N junction 118 between the drain region 114 and the channel region 116 is also decreased. When the breakdown voltage is decreased, the current flow during programming will also increase which may cause problems with the operation of the entire memory chip and the functionality of the array.

Figure 15:
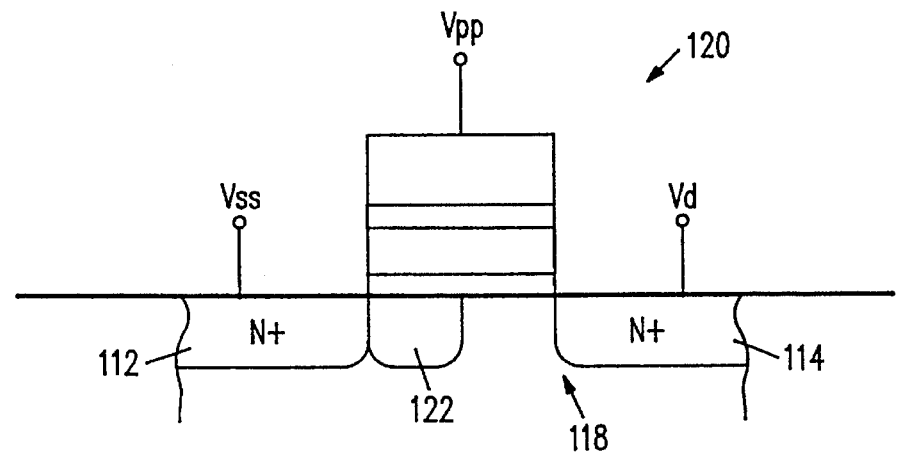
FIG. 15 is a cross-sectional diagram illustrating an implanted-channel transistor 120 in accordance with a second alternative embodiment of the present invention.

FIG. 15 shows a cross-sectional diagram that illustrates an implanted-channel transistor 120 in accordance with a second alternative embodiment of the present invention. As shown in FIG. 15, instead of implanting the entire channel region of the implanted-channel transistor 120, the same result can be achieved by implanting only a portion 122 of the channel region which is adjacent to the source region 112.

Thus, in accordance with the second alternative embodiment, by implanting only portion 122, the threshold voltage can be controlled, as described above, while simultaneously lowering the breakdown voltage of P-N junction 118. In the preferred embodiment of the second alternative embodiment, the boron or similar material, such as boron difluoride ($BF_2$), is implanted to a concentration of approximately $1\times10^-$cm$^{-3}$.

Thus, a novel nonvolatile semiconductor memory array and method have been disclosed which avoid the need for field oxide (FOX) islands for the purpose of providing electrical isolation. Although a preferred embodiment has been described in some detail, it is to be understood that certain changes can be made by those skilled in the art without departing from the spirit and scope of the invention as defined by the appended claims.

What is claimed is:

1. A method of forming a memory array that includes a plurality of bit lines formed in a substrate, a plurality of rows of memory cells arranged so that, in each row, one memory cell is formed between each pair of adjacent bit lines, and a plurality of rows of select cells arranged so that, in each row, one select cell is formed between each pair of adjacent bit lines, each row of select cells having alternating first and second select cells, the method comprising the steps of:

forming a layer of sacrificial oxide on the substrate;

forming an implant mask on the layer of sacrificial oxide, the implant mask defining a plurality of channel regions for the second select cells; and implanting the channel regions with a material that increases the threshold voltage of the second select cells so that when a first select cell in a row is biased to conduct a current, the second select cells in the row remain non-conductive.

2. A method of forming a memory array that includes a plurality of bit lines formed in a substrate, a plurality of rows of memory cells arranged so that, in each row, one memory cell is formed between each pair of adjacent bit lines, and a plurality of rows of select cells arranged so that, in each row, one select cell is formed between each pair of adjacent bit lines, each row of select cells having alternating first and second select cells, the method comprising the steps of:

forming a layer of sacrificial oxide on the substrate;

forming an implant mask on the layer of sacrificial oxide, the implant mask defining a portion of a channel region for each second select cell; and implanting the portion of the channel region of each second select cell with a material that increases the threshold voltage of the second select transistor cells so that when a first select cell in a row is biased to conduct a current, the second select cells in the row remain non-conductive.

3. The method of claim 1 wherein the substrate includes a $P^-$-type substrate.

4. The method of claim 2 wherein the substrate includes a $P^-$-type substrate.

5. The method of claim 1 wherein, in going down each column of the array, every other select cell is formed as a second select cell.

6. The method of claim 2 wherein, in going down each column of the array, every other select cell is formed as a second select cell.

7. The method of claim 1 wherein the material includes boron.

8. The method of claim 2 wherein the material includes boron.

9. The method of claim 1 wherein the material includes $BF_2$.

10. The method of claim 1 wherein the material includes $BF_2$.

* * * * *

UNITED STATES PATENT AND TRADEMARK OFFICE
CERTIFICATE OF CORRECTION

PATENT NO. : 5,512,504
DATED : Apr. 30, 1996
INVENTOR(S) : Graham Wolstenholme, et al It is certified that error appears in the above-indentified patent and that said Letters Patent is hereby corrected as shown below:

On title page, under Related U.S. Application Data, line [60] after "Pat. No.", delete "5,422,824", and replace with --5,422,844--.

In Col. 10, line 15, delete "1" and replace with --2--.

Signed and Sealed this

Twenty-third Day of July, 1996

Attest:

BRUCE LEHMAN

*Attesting Officer*     *Commissioner of Patents and Trademarks*